United States Patent
Lu et al.

(10) Patent No.: US 9,454,979 B1
(45) Date of Patent: Sep. 27, 2016

(54) SENSOR STRUCTURE WITH MULTILAYER TOP SHIELD

(71) Applicant: Seagate Technology LLC, Cupertino, CA (US)

(72) Inventors: Zhengqi Lu, Londonderry (GB); Daniel Hassett, Newtowncunningham (IE); Paula McElhinney, Derry (GB); Jiansheng Xu, Londonderry (GB)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 0 days.

(21) Appl. No.: 14/940,360

(22) Filed: Nov. 13, 2015

Related U.S. Application Data

(60) Provisional application No. 62/079,675, filed on Nov. 14, 2014.

(51) Int. Cl.
*G11B 5/39* (2006.01)
*G11B 5/33* (2006.01)

(52) U.S. Cl.
CPC ............. *G11B 5/3912* (2013.01); *G11B 5/332* (2013.01)

(58) Field of Classification Search
CPC .................................................. G11B 5/3912
USPC ........................................................ 360/319
See application file for complete search history.

(56) References Cited

U.S. PATENT DOCUMENTS

| | | | |
|---|---|---|---|
| 6,496,335 B2 | 12/2002 | Gill | |
| 8,035,910 B2 | 10/2011 | Mallary et al. | |
| 8,514,524 B2 | 8/2013 | Wu et al. | |
| 8,531,801 B1* | 9/2013 | Xiao | G11B 5/3909 360/319 |
| 8,630,069 B1 | 1/2014 | Okawa et al. | |
| 8,780,505 B1* | 7/2014 | Xiao | G11B 5/3909 360/319 |
| 8,797,692 B1* | 8/2014 | Guo | G11B 5/3909 360/319 |
| 8,830,635 B2* | 9/2014 | Watanabe | G11B 5/3909 360/319 |
| 9,269,381 B1* | 2/2016 | Sapozhnikov | G11B 5/3912 |
| 9,368,136 B2* | 6/2016 | Lu | G11B 5/3912 |
| 9,384,764 B1* | 7/2016 | Biskeborn | G11B 5/40 |
| 9,406,319 * | 8/2016 | Biskeborn | G11B 5/255 |
| 2002/0064002 A1* | 5/2002 | Gill | G11B 5/11 360/319 |
| 2012/0327537 A1* | 12/2012 | Singleton | G11B 5/3912 360/244 |
| 2013/0233823 A1 | 9/2013 | Vas'ko et al. | |
| 2013/0293225 A1 | 11/2013 | Singleton et al. | |
| 2014/0218821 A1 | 8/2014 | Lu et al. | |
| 2014/0252518 A1* | 9/2014 | Zhang | H01L 43/12 257/422 |
| 2014/0268417 A1 | 9/2014 | Singleton et al. | |
| 2014/0340793 A1* | 11/2014 | Song | G11B 5/11 360/319 |
| 2015/0248903 A1* | 9/2015 | Aoyama | G11B 5/398 360/99.08 |
| 2015/0371666 A1* | 12/2015 | Xiao | G11B 5/11 360/319 |
| 2016/0005424 A1* | 1/2016 | McKinlay | G11B 5/115 360/121 |

* cited by examiner

*Primary Examiner* — Jefferson Evans
(74) *Attorney, Agent, or Firm* — HolzerIPLaw, PC

(57) ABSTRACT

A reader sensor comprising a sensor stack and a composite top shield. The composite top shield includes a bulk shield portion and a SAF portion, the SAF portion comprising a top magnetic layered structure and a bottom magnetic layered structure with a non-magnetic layer therebetween. Each of the magnetic layered structures has at least one soft magnetic material layer bounded by layers comprising magnetic material having a magnetic moment of at least 1.4 T.

20 Claims, 10 Drawing Sheets

SENSOR STRUCTURE WITH MULTILAYER TOP SHIELD

CROSS-REFERENCE TO RELATED APPLICATION

This application claims priority under 35 U.S.C. 119(e) to U.S. provisional application 62/079,675 filed Nov. 14, 2014, the entire disclosure of which is incorporated herein for all purposes.

BACKGROUND

In a magnetic data storage and retrieval system, a magnetic read/write head includes a reader portion having a magnetoresistive (MR) reader sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information to recover the information encoded on the disc.

SUMMARY

One particular implementation described herein is a reader sensor having a sensor stack and a composite upper or top shield. The composite shield includes a bulk shield portion and a synthetic antiferromagnetic (SEW) portion, the SAF portion comprising a top magnetic layered structure and a bottom magnetic layered structure with a non-magnetic layer therebetween. At least one of the magnetic layered structures has a soft magnetic material layer bounded by layers having a magnetic moment of at least 1.4 T. In another implementation, at least one of the magnetic layers structures has a soft magnetic material layer bounded by layers comprising a magnetic material having a moment of at least 1.4 T.

Another particular implementation is a reader sensor having a sensor stack and a composite top shield having a bulk shield portion and a SAF portion. The SAF portion of the top shield has a top magnetic layered structure and a bottom magnetic layered structure with a non-magnetic layer therebetween. Each of the magnetic layered structures has at least one soft magnetic material layer bounded by layers that include corrosion-resistant magnetic material.

Yet another particular implementation is a reader sensor having a sensor stack and a top composite shield having a bulk shield portion and a SAF portion. The SAF portion has a top magnetic layered structure and a bottom magnetic layered structure with a non-magnetic layer therebetween, with each of the magnetic layered structures having "X" soft magnetic material layers and "X+1" corrosion-resistant magnetic layers having a magnetic moment of at least 1.4 T.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following detailed description.

BRIEF DESCRIPTIONS OF THE DRAWING

The described technology is best understood from the following Detailed Description describing various implementations read in connection with the accompanying drawings.

DETAILED DESCRIPTION

Figure 1:
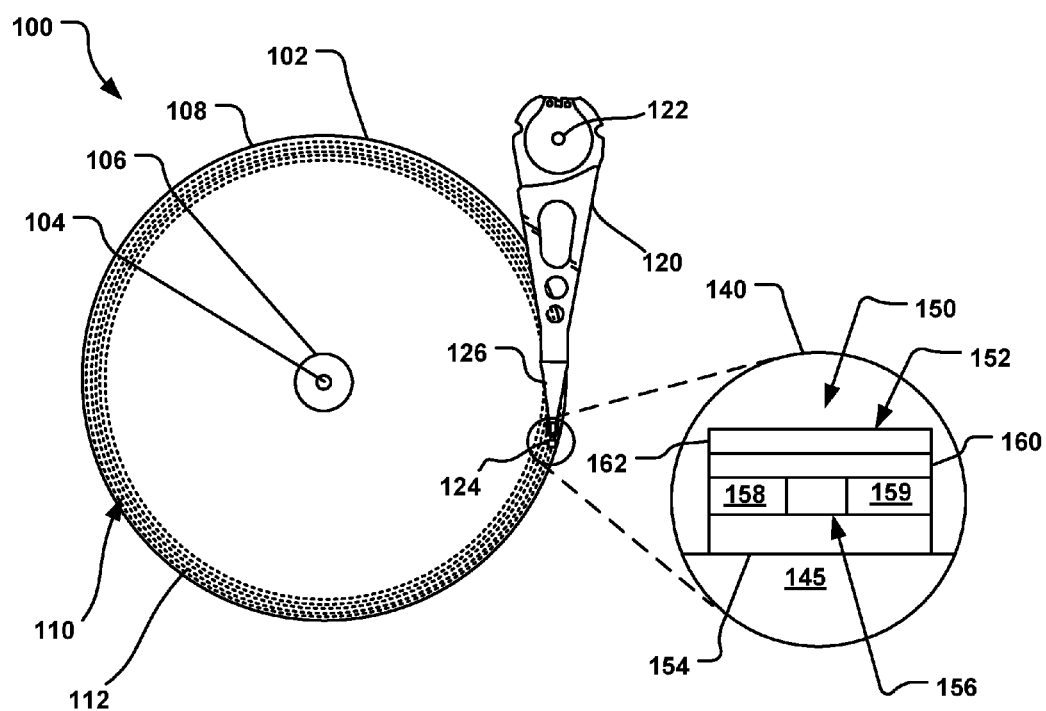
FIG. 1 is a perspective view of an example recording device with a reader sensor having a composite top shield.

Magnetoresistive (MR) sensors such as giant magnetoresistive (GMR) sensors and tunneling magnetoresistive (TMR) sensors are used in magnetic data storage systems to detect magnetically encoded information stored on a magnetic data storage medium, such as a magnetic disc. A time dependent magnetic field from the magnetic medium directly modulates the resistivity of the MR sensor. A change in resistance can be detected by passing a current through the MR sensor and measuring the voltage across the MR sensor. The resulting signal can be used to recover the encoded information from the magnetic medium.

A typical GMR sensor configuration is the spin valve, in which the GMR sensor includes a non-magnetic spacer layer positioned between a ferromagnetic "pinned" reference layer (RL) and a ferromagnetic free layer (FL). The magnetization of the pinned RL is fixed in a predetermined direction exchanged coupled by a pinned layer (PL), which is pinned by an antiferromagnetic (AFM) material (often called a "pinning layer"). The magnetization of the FL is free to rotate in response to external magnetic field.

The resistance of the GMR sensor varies as a function of an angle formed between the magnetization direction of the FL and the magnetization direction of the RL. Spin valves operate in either a current-in-plane (CIP) mode or a current-perpendicular-to-plane (CPP) mode. In CIP mode, the sense current is passed through the device in a direction parallel to the layers of the device. In the CPP mode, a sensing current is passed through the device in a direction perpendicular to the layers of the device.

A TMR sensor is similar in structure to a CPP spin valve, but the physics of the device differ. A TMR sensor, rather than having a spacer layer, has a barrier layer between the FL and the RL through which electrons pass between the FL and RL. A sensing current flowing perpendicular to the plane of the layers of the TMR device experiences a resistance that is proportional to the cosine of an angle formed between the magnetization direction of the FL and the magnetization direction of the pinned RL.

There is an increasing demand for high data densities, higher density sensors, and physically smaller MR sensors. However, as the size of the MR sensors decreases, the variation in magnetization direction of the PL increases. Thus, more stabilization of the MR sensor is needed.

The assembly of the various layers the GMR/TMR sensors, as discussed above, is also referred to as a sensor stack. Such sensor stacks may be surrounded by a bottom shield and a top shield to shield the sensor from any magnetic influences that are generated from other components of the MR sensor; these shields can be referred to as bulk shields. The distance between the top shield and the bottom shield (not including the top and bottom shields) is referred to as the shield-to-shield spacing (SSS). PW50, which is the pulse width of a magnetic element at 50% of the pulse amplitude, is indicative of the spatial resolution of the sensor. The PW50 of MR sensors, which determines the signal-to-noise ratio (SNR) in a recording system, depends on the SSS of the head. Specifically, a reduction in the SSS leads to reduction in the value of the PW50 and therefore, an increase in the value of the SNR for the recording system. However, using SSS reduction to achieve lower PW50 has its limits.

An example sensor structure disclosed herein provides strong magnetic anisotropy and high magnetic moment, which improves the stability of other shields in the sensor structure and improves (decreases) PW50. Specifically, the sensor structure includes a reader sensor or "stack" surrounded by a bottom shield and a top shield in down-track direction, where the top shield (which is the shield that encounters the magnetic medium after the stack encounters the medium) is a composite, or laminated, shield. The composite or laminated shield has a bulk shield portion and a synthetic antiferromagnetic (SAF) portion, the SAF portion being closer to the sensor stack than the bulk shield portion. The SAF portion has a bottom laminated magnetic structure, a non-magnetic spacer, a top laminated magnetic structure, and an AFM layer. The SAF portion is closer to the sensor stack than the bulk shield portion, and in some implementations the SAF portion is proximate to and/or adjacent to the sensor stack. In some implementations, a non-magnetic cap layer (e.g., proximate the bulk shield portion) is included.

It is noted that the technology disclosed herein may be used in conjunction with a variety of different types of magnetic or MR sensors (e.g., anisotropic magnetoresistive (AMR) sensors, TMR sensors, GMR sensors, etc.). Accordingly, the implementations discussed may also be applicable to new sensor designs that are based on new physical phenomena such as lateral spin valve (LSV), spin-hall effect (SHE), spin torque oscillation (STO), etc.

In the following description, reference is made to the accompanying drawing that forms a part hereof and in which are shown by way of illustration at least one specific implementation. The following description provides additional specific implementations. It is to be understood that other implementations are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

FIG. 1 illustrates a perspective view of an example recording device 100 using a reader sensor disclosed herein. Recording device 100 includes a disc 102, which rotates about a spindle center or a disc axis of rotation 104 during operation. The disc 102 includes an inner diameter 106 and an outer diameter 108 between which are a number of concentric data tracks 110, illustrated by dashed lines. The data tracks 110 are substantially circular and are made up of regularly spaced bits 112, indicated as dots or ovals on the disc 102. It should be understood, however, that the described technology may be employed with other types of storage media, including continuous magnetic media, discrete track (DT) media, etc.

Information is written to and read from the bits 112 on the disc 102 in different data tracks 110. An actuator assembly 120 having an actuator axis of rotation 122 supports a transducer head 124 via a head-gimbal-assembly (HGA) 126 at the distal end of the actuator assembly 120. The transducer head 124 flies in close proximity above the surface of the disc 102 during disc operation. The actuator assembly 120 rotates during a seek operation about the actuator axis of rotation 122 positioned adjacent to the disc 102. The seek operation positions the transducer head 124 over a target data track of the data tracks 110.

An exploded view 140 illustrates an expanded, schematic and simplified view of the transducer head 124, with a reader sensor 150 illustrated by a schematic block diagram that illustrates an air-bearing surface (ABS) view of the reader sensor 150. In the illustrated implementation, the reader sensor 150 in respect to a substrate 145 is illustrated to include a top shield 152 and a bottom shield 154, with a sensor stack 156 between the shields 152, 154 along the down-track direction of the reader 150. The sensor 150 is arranged with the top shield 152 farther from the substrate 145 than the bottom shield 154. The top shield 152 and the bottom shield 154 protect the sensor stack 156 from flux from adjacent data tracks 110 on the disc 102. The details of which are not shown, sensor stack 156 includes multiple layers, including a free layer that has a switchable magnetic orientation. Also between the top shield 152 and the bottom shield 154, in the cross-track or lateral direction to the sensor stack 156, are side shields 158, 159.

In accordance with this disclosure, the top shield 152 is a composite shield, composed of two portions, a SAF portion 160 composed of numerous layers, some layers being magnetic and at least one layer being a non-magnetic spacer, and a bulk shield portion 162. The bulk shield portion 162 can be any suitable shield structure.

At least one of the magnetic layers on each side of the non-magnetic spacer in the SAF portion 160 has a magnetic moment of at least 1.4 T, in some implementations greater than 1.4 T. The layer may be formed from a magnetic material having a magnetic moment of at least 1.4 T or greater than 1.4 T or may be formed from more than one magnetic material, with the combined magnetic moment of the layer being at least 1.4 T. In some implementations, the magnetic moment of one of the magnetic layers of the SAF portion 160 is at least 1.8 T, or at least 2.0 T, or at least 2.1 T, or even at least 2.4 T. It is the high magnetic moment material and/or layer that shields stray magnetic fields more effectively and thus improves (decreases) PW50.

Additionally, at least one of the magnetic layers in the SAF portion 160 has a high resistance to corrosion; that is, the layer is corrosion resistant. Examples of corrosion resistant magnetic materials include NiFe, CoFeNiB and CoFe. The corrosion resistant layer may be the same layer or a different layer than that having the magnetic moment of at least 1.4 T.

The SAF portion 160 provides improved shield stabilization due to increased magnetic anisotropy arising from SAF coupling within the SAF portion 160. Additionally, the SAF portion 160 improves (decreases) PW50 due to a high magnetic moment structure near the sensor stack, particularly the free layer of the sensor stack. Further, the SAF portion 160 shields stray magnetic fields better than bulk shields, and equivalently reduces SSS, which also lead to improved PW50.

Figure 2:
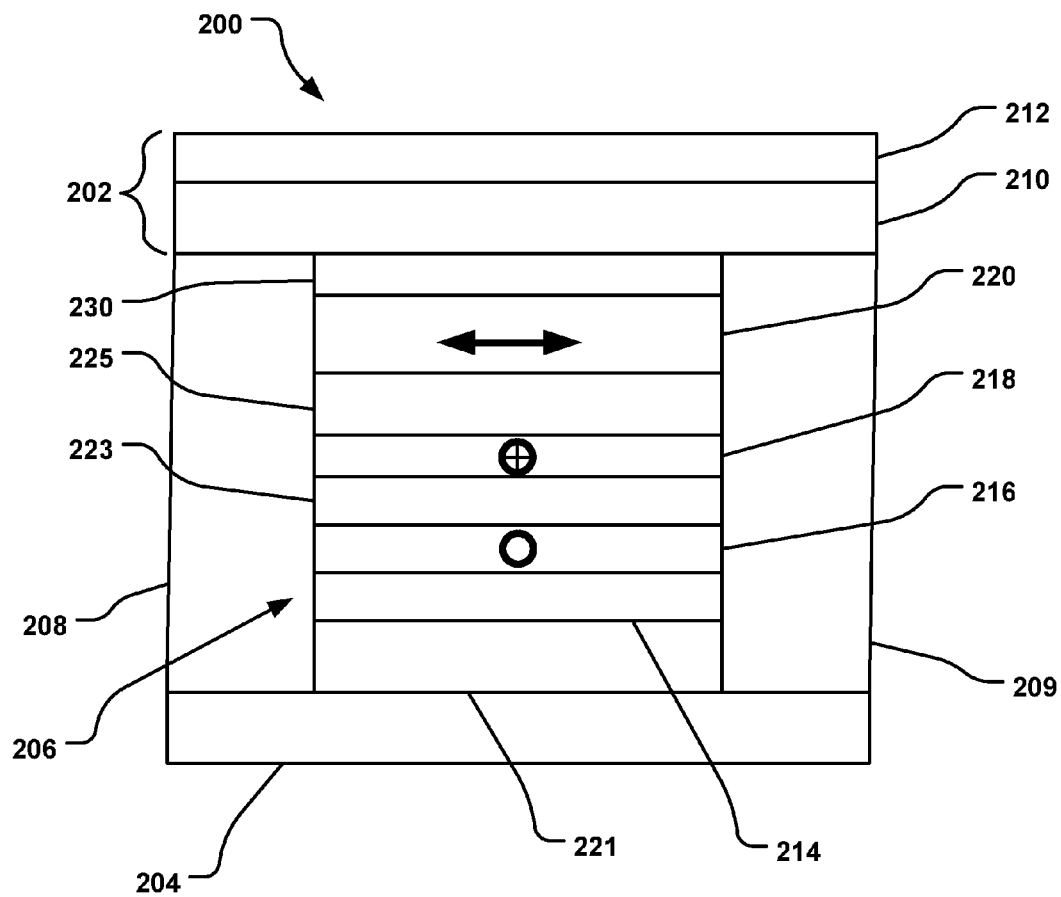
FIG. 2 is a schematic air-bearing surface (ABS) view of an example reader sensor structure.

FIG. 2 illustrates an ABS view of an example implementation of a sensor structure, particularly, of a reader sensor 200, similar to reader sensor 150 of FIG. 1, focusing on a particular implementation of a sensor stack.

The reader 200 includes a top shield 202 and a bottom shield 204 around a sensor stack 206 that has multiple layers, which are detailed below. Also between the top shield 202 and the bottom shield 204, in the cross-track or lateral direction to the sensor stack 206, are side shields 208, 209.

In the illustrated implementation, the side shields 208, 209 encompass all layers of the sensor stack 206, however in other implementations, the side shields 208, 209 may not encompass one or more of the layers that form the sensor stack 206. The side shields 208, 209 may be hard magnetic or permanent magnets (PM), and may have high magnetic moment (i.e., greater than 1.0 T) or low magnetic moment (i.e., 1.0T or less), such as a soft magnet. The side shields 208, 209 provide a magnetic biasing field on the free layer in the sensor stack 206. The side shields 208, 209 can be directly magnetically coupled with the top shield 202.

The top shield 202 is a composite shield composed of two portions, a SAF portion 210 composed of numerous layers, some layers being magnetic and at least one layer being a non-magnetic spacer, and a bulk shield portion 212. In this implementation, the SAF portion 210 is in contact with the side shields 208, 209 and the sensor stack 206.

The particulars of the specific construction of the reader sensor stack 206 and side shields 208, 209 are not of particular relevance to the composite top shield 202, however, an exemplary structure of sensor stack 206 is illustrated in FIG. 2 and described below.

Shown in FIG. 2, the sensor stack 206 has an antiferromagnetic (AFM) layer 214, a magnetic pinned layer (PL) 216, a magnetic reference layer (RL) 218 and a soft magnetic free layer (FL) 220 with a magnetization orientation that rotates freely in response to an external magnetic field. Relative magnetization orientations for PL 216, RL 218 and FL 220 are illustrated in FIG. 2. The AFM layer 214, often called the "pinning layer", prevents the magnetization of the adjacent PL 216 from rotating. Examples of suitable materials for the AFM layer 214 include PtMn, IrMn, IrMnCr, NiMn, FeMn, CrPMn, CrNiMn, and CrFeMn.

The FL 220, RL 218 and PL 216 are formed from a ferromagnetic material or from a synthetic ferromagnetic material or structure. A ferromagnetic layer is typically a ferromagnetic alloy, such as CoFe, NiFe, CoNiFe, CoFeTa, or CoFeB.

A seed layer 221 is shown between the bottom shield 204 and the AFM layer 214. The seed layer 221 promotes the texture and grain formation of the AFM layer 214.

Between the PL 216 and the RL 218 is a non-magnetic coupling spacer layer 223 that results in antiferromagnetic coupling between the magnetic RL 218 and the magnetic PL 216, resulting in opposing magnetization orientations for the RL 218 and the PL 216.

Between the RL 218 and FL 220 is an insulating barrier layer or a conductive spacer layer 225. If the layer 225 is a spacer layer, examples of suitable materials for layer 225 include Cu, Ag and Au, whereas if the layer 225 is a barrier layer, examples of suitable materials for layer 225 include $Al_2O_3$, TiO, TaO, and MgO.

A capping or cap layer 230 is at the top layer of the stack 206, between the FL 220 and the composite top shield 202, in this implementation, adjacent to the SAF portion 210.

FIGS. 3, 4 and 6 through 8 illustrate various alternate implementations of SAF portions of a composite top shield. Each of the SAF portions includes two magnetic structures (a top magnetic structure and a bottom magnetic structure) separated by a non-magnetic spacer. By use of the relative terms "top magnetic structure," "bottom magnetic structure," and variations there of, what is intended is that the top structure is closer to the bulk shield portion than the bottom structure, and that the bottom structure is closer to the stack than the top structure. At least one of the magnetic structures is a multilayer structure having at least two layers, one layer having a magnetic moment of at least 1.4 T. In some implementations, the multilayer structure has at least two layers having a magnetic moment of at least 1.4 T, the two layers separated by a soft magnetic layer. Any of these SAF portions of FIGS. 3, 4 and 6 though 8 may be incorporated into the composite top shield 152 of FIG. 1 and/or the top shield 202 of FIG. 2.

Figure 3:
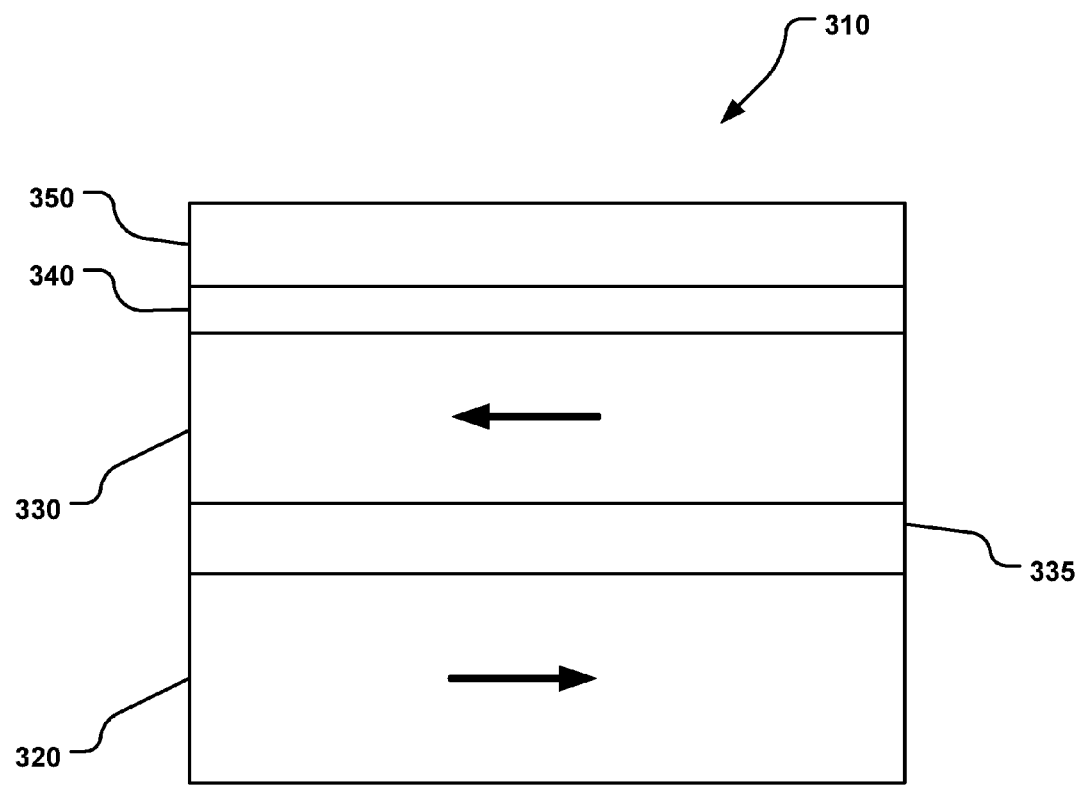
FIG. 3 is a schematic ABS view of an example SAF portion of a composite top shield.

FIG. 3 illustrates a schematic block diagram of an ABS view of an example implementation of a SAF portion 310 of a composite top shield. The SAF portion 310 has a lower or bottom laminated magnetic structure 320, a top laminated magnetic structure 330, and a non-magnetic spacer 335 there between. The bottom laminated magnetic structure 320 and the top laminated magnetic structure 330 are antiferromagnetically coupled through layer 335. Adjacent to the top laminated magnetic structure 330 is an AFM layer 340 and a non-magnetic capping layer 350. One or both of the bottom laminated magnetic structure 320 and the top laminated magnetic structure 330 are multilayer structures having a high magnetic moment layer, such as at least two high magnetic moment layers separated by a soft magnetic layer.

The at least two high magnetic moment layers in the SAF portion 310, which layers are both in either the bottom laminated magnetic structure 320 or the top laminated magnetic structure 330, or one layer in each the bottom laminated magnetic structure 320 and the top laminated magnetic structure 330, have a magnetic moment of at least 1.4 T. The layers are formed from a magnetic material having a high magnetic moment of at least 1.4 T. In some implementations, the magnetic moment of the material is at least 1.8 T, or at least 2.0 T, or at least 2.1 T, or even at least 2.4 T. In some implementations, the magnetic moment of the layers is at least 1.8 T, or at least 2.0 T, or at least 2.1 T, or even at least 2.4 T.

The high magnetic moment layers are not required to be the same material or have the same material(s), although having the same material facilitates processing of the layers. Further, the at least two high magnetic moment layers need not have the same thickness. General examples of high magnetic moment alloys include $NiFe_{40-90}$, or Co alloys such as CoFe, CoFeB, CoFeNiB and FeCoNi, and FeSi, and FeC. Particular examples of high magnetic moment alloys include $Fe_{44-46}Co_{39-42}Ni_{14.5-15}$ (2.1 T), $Fe_{54-56}Ni_{27-29}Co_{16-18}$ (1.8 T), $Fe_{86-90}Cr_{10-14}$ (1.8 T), $Fe_{52-62}CO_{26-36}Cr_{10-14}$ (1.9 T), where the subscripts indicate the range of atomic percentages for each element in the alloy.

Present between the two high magnetic moment layers is at least one soft magnetic layer, i.e., having a magnetic moment less than the magnetic moment of the high magnetic moment layers. In some implementations, the soft magnetic layer has a magnetic moment no greater than 1.8 T, and in some implementations no greater than 1.6 T, or no greater than 1.4 T, or no greater than 1.2 T, or no greater than 1.1 T, or no greater than 1.0 T. Examples of soft magnetic material include NiFeX alloys (e.g., NiFe, NiFeCr, NiFeW, NiFeMo, CoNiFe. CoFeNiB, etc.), and specific examples include "permalloy" ($Ni_{81}Fe_{19}$ (1.0 T)) and $Ni_{45}Fe_{55}$ (1.6 T). "Sendust" ($Al_{5.4}Fe_{65}Si_{9.6}$ (1.1 T)) is also a suitable soft magnetic material. If multiple soft magnetic layers are present, whether all between the two high magnetic moment layers or not, they need not be the same material, although having the same material facilitates processing. Further, multiple soft magnetic layers are not required to have the same thickness.

Any or all of the layers can have a high resistance to corrosion; that is, they have little or no corrosion issue(s) during the processing (manufacturing) of the reader head and/or the transducer and during use of the reader head in the storage device. Corrosion resistance is particularly beneficial for the high magnetic moment layers.

Figure 4:
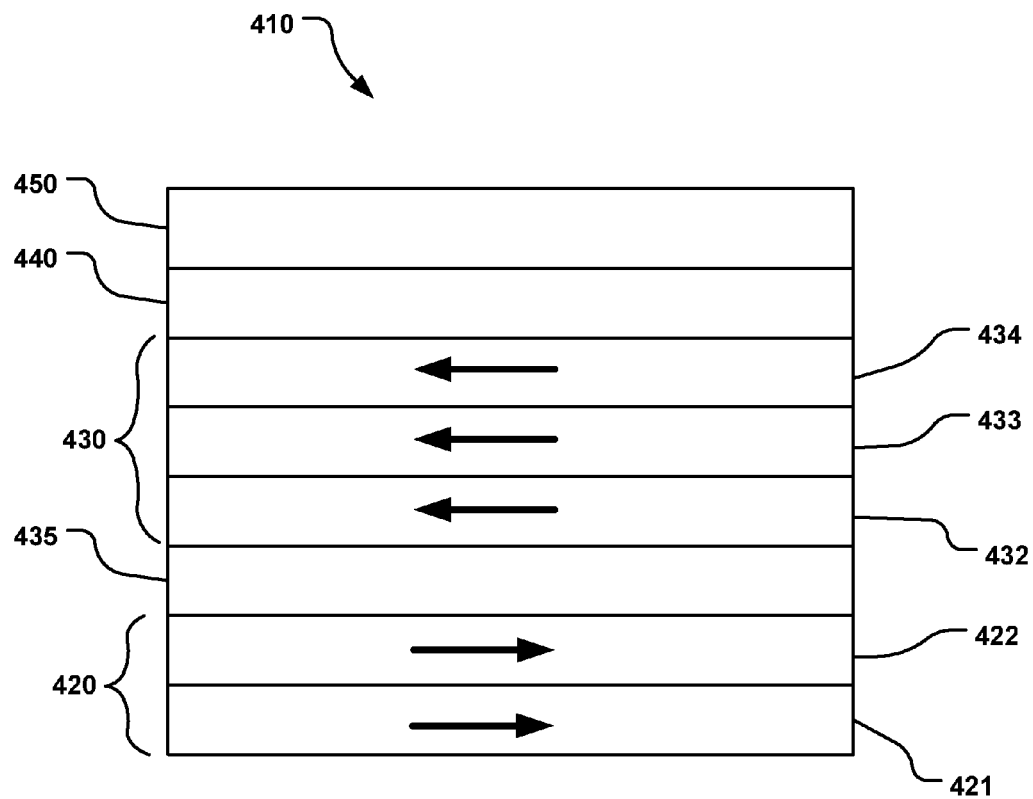
FIG. 4 is a schematic ABS view of another example SAF portion of a composite top shield.

FIG. 4 illustrates a schematic block diagram of an ABS view of an example implementation of a SAF portion 410 that can be incorporated into the composite top shield 152 of FIG. 1 and/or top shield 202 of FIG. 2. The various features and elements of the SAF portion 410 are the same as or similar to like features and elements of SAF portion 310, unless indicated otherwise. This SAF portion 410 has a three-layered laminated magnetic structure for the top structure.

The SAF portion 410 has a lower or bottom laminated magnetic structure 420, a top laminated magnetic structure 430, and a non-magnetic spacer 435 there between. At least one of the bottom laminated magnetic structure 420 and the top laminated magnetic structure 430 are multilayer structures having a high magnetic moment layer, such as at least two high magnetic moment layers separated by a soft magnetic layer. The SAF portion 410 also has an AFM layer 440 and a non-magnetic capping layer 450.

In this implementation, the bottom laminated magnetic structure 420 has a first magnetic layer 421 and a second magnetic layer 422; the first layer 421 and the second layer 422 may have the same or different magnetic moment, be formed from the same or different materials, and may have the same or different thicknesses. The top laminated magnetic structure 430 has high magnetic moment layers 432, 434, and a soft magnetic layer 433 different than the layers 432, 434. The number of high magnetic moment layers in the top laminated magnetic structure 430 is X+1, where X is the number of soft magnetic layers.

Figure 5A:
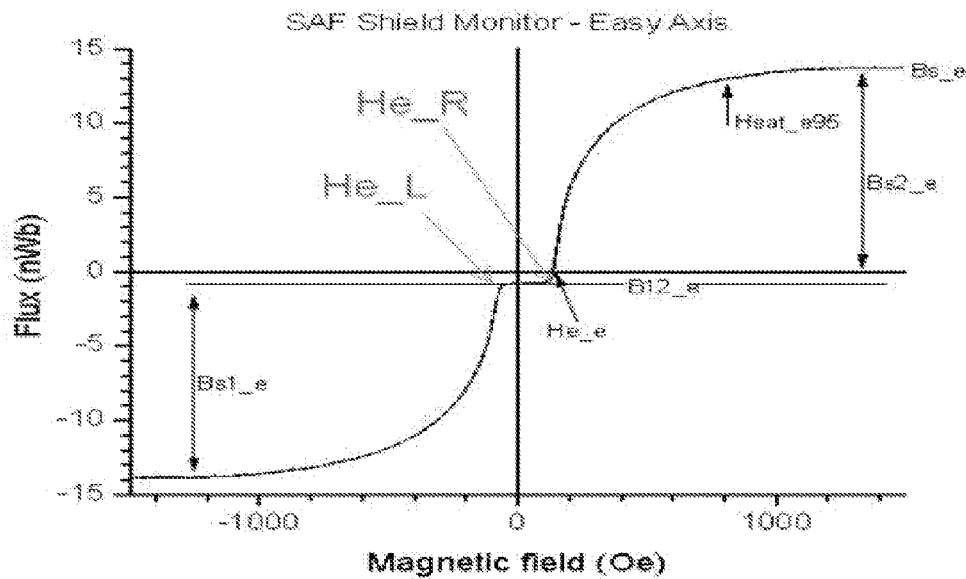
FIGS. 5A and 5B are graphical representations of BH loops for a laminated upper shield of a sensor structure disclosed herein.
Figure 5B:
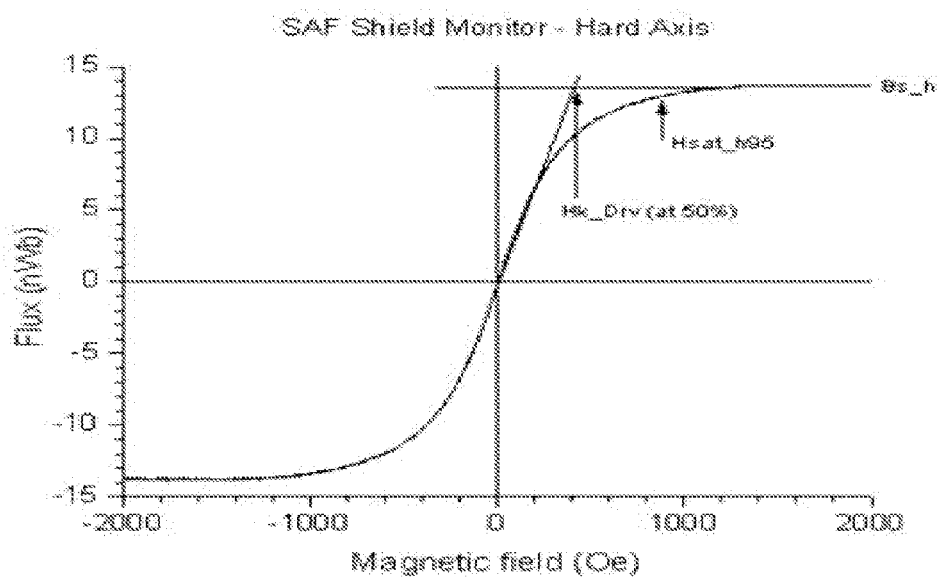

FIGS. 5A and 5B show BH loops of a SAF portion having a top laminated magnetic structure, such as that from FIG. 4. The graphs show the magnetic flux response to an applied magnetic field. The particular graph shown is typical of an SAF layer with Hk of approximately 500 Oe and Hsat_H95 of 1100 Oe.

Figure 6:
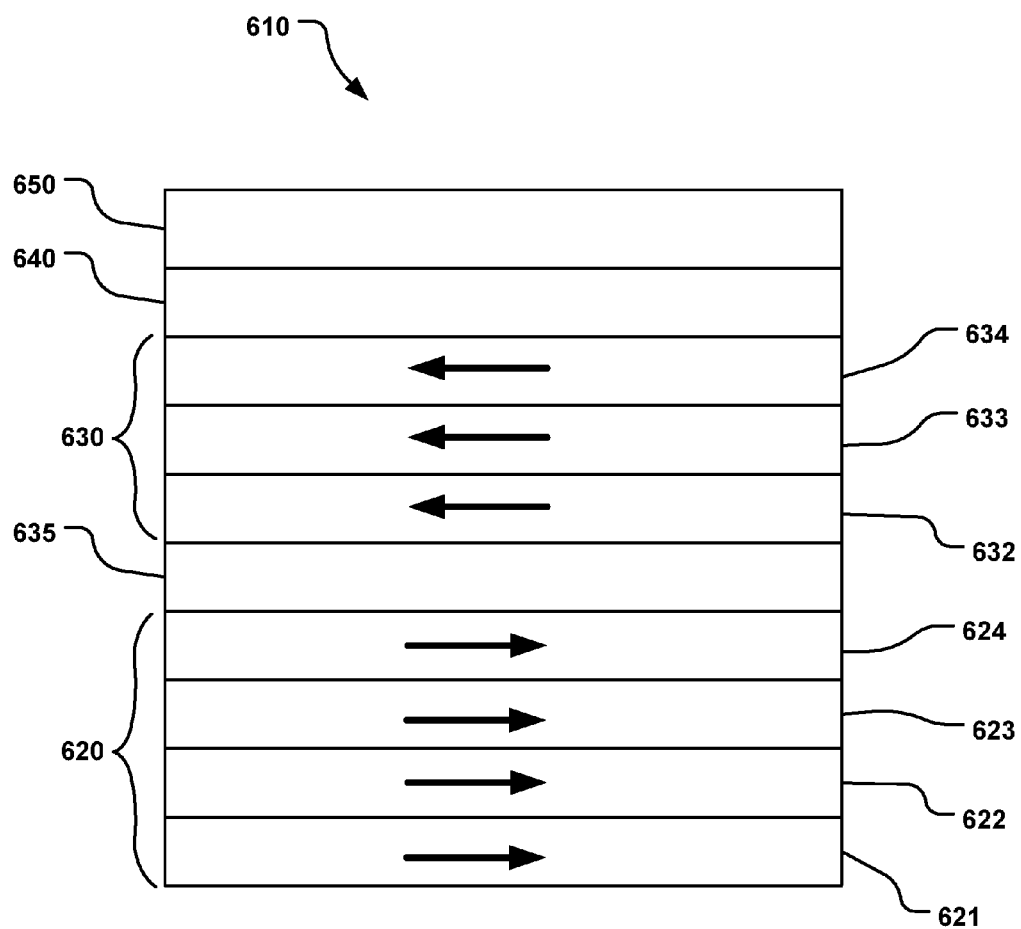
FIG. 6 is a schematic ABS view of another example SAF portion of a composite top shield.

FIG. 6 illustrates a schematic block diagram of an ABS view of another example implementation of a SAF portion 610 that can be incorporated into a composite top shield. The various features and elements of the SAF portion 610 are the same as or similar to like features and elements of SAF portions 310, 410 unless indicated otherwise. This SAF portion 610 has a three-layered laminated magnetic structure for the top structure and a three-layer plus seed layer laminated magnetic structure for the bottom structure.

The SAF portion 610 has a lower or bottom laminated magnetic structure 620, a top laminated magnetic structure 630, and a non-magnetic spacer 635 there between. Both bottom magnetic structure 620 and top magnetic structure 630 are multilayer structures having a high magnetic moment layer, such as at least two high magnetic moment layers separated by a soft magnetic layer. The SAF portion 610 also has an AFM layer 640 and a non-magnetic capping layer 650.

In this implementation, the bottom laminated magnetic structure 620 has a magnetic seed layer 621 (which improves grain structure of other layers), two high magnetic moment layers 622, 624 and a soft magnetic layer 623 different than the layers 622, 624. The number of high moment layers (i.e., layers 622, 624) in the lower magnetic structure 620 is X+1, where X is the number of soft magnetic layers (i.e., layer 623).

The top magnetic structure 630 has high magnetic moment layers 632, 634, and a soft magnetic layer 633 different than the layers 632, 634. The number of high moment layers (i.e., layers 632, 634) in the top magnetic structure 630 is X+1, where X is the number of soft magnetic layers (i.e., layer 633).

The seed layer 621 can be a soft magnetic material, such as a NiFeX alloy (e.g., NiFe, NiFeCr, NiFeW, NiFeMo, etc.) or a CoFeX alloy (e.g., CoFeTa) with a thickness of, e.g., less than about 4 nm.

The high magnetic moment layers 622, 624, 632, 634 have a magnetic moment of at least 1.8 T or greater than 1.8 T and are made of at least one material having a high magnetic moment (of at least 1.8 T or greater than 1.8 T), for example, at a thickness of about 0.5 nm to 30 nm.

The soft magnetic layers 623, 633 are made of soft magnetic material, having a magnetic moment no greater than the magnetic moment of this high magnetic moment layers (e.g., having a magnetic moment no greater than 1.8 T), for example, at a thickness of about 1 nm to 40 nm.

The non-magnetic spacer 635 is an antiferromagnetic coupling layer and can be, e.g., Cu, Cr, Ag, Ru, Mo, etc., with a thickness of about 0.3 nm to 1 nm.

The AFM layer 640 is typically PtMn, IrMn, NiMn, FeMn, PtMnCr, IrMnCr, NiMnCr, or FeMnCr, at a thickness of about 5 nm to about 10 nm.

One specific example of a SAF portion 610 has the following layers:

| Layer | Material | Layer thickness |
| --- | --- | --- |
| High Mag. Moment Layer 634 | CoFe65% | 4.5 nm |
| Soft Magnetic Layer 633 | NiFe21% | 14 nm |
| High Mag. Moment Layer 632 | CoFe65% | 3 nm |
| Non-magnetic Spacer 635 | Ru | 0.85 nm |
| High Mag. Moment Layer 624 | CoFe65% | 3 nm |
| Soft Magnetic Layer 623 | NiFe21% | 12 nm |
| High Mag. Moment Layer 622 | CoFe65% | 6 nm |
| Seed Layer 621 | NiFe21% | 0.5 nm |

Another specific example of a SAF portion 610 has the following layers:

| Layer | Material | Layer thickness |
| --- | --- | --- |
| High Mag. Moment Layer 634 | CoFe30% | 2 nm |
| Soft Magnetic Layer 633 | NiFe21% | 25 nm |
| High Mag. Moment Layer 632 | CoFe30% | 2 nm |
| Non-magnetic Spacer 635 | Ru | 0.85 nm |
| High Mag. Moment Layer 624 | CoFe30% | 2 nm |
| Soft Magnetic Layer 623 | NiFe21% | 12.5 nm |
| High Mag. Moment Layer 622 | CoFe30% | 7.5 nm |
| Seed Layer 621 | NiFe21% | 0.5 nm |

Figure 7:
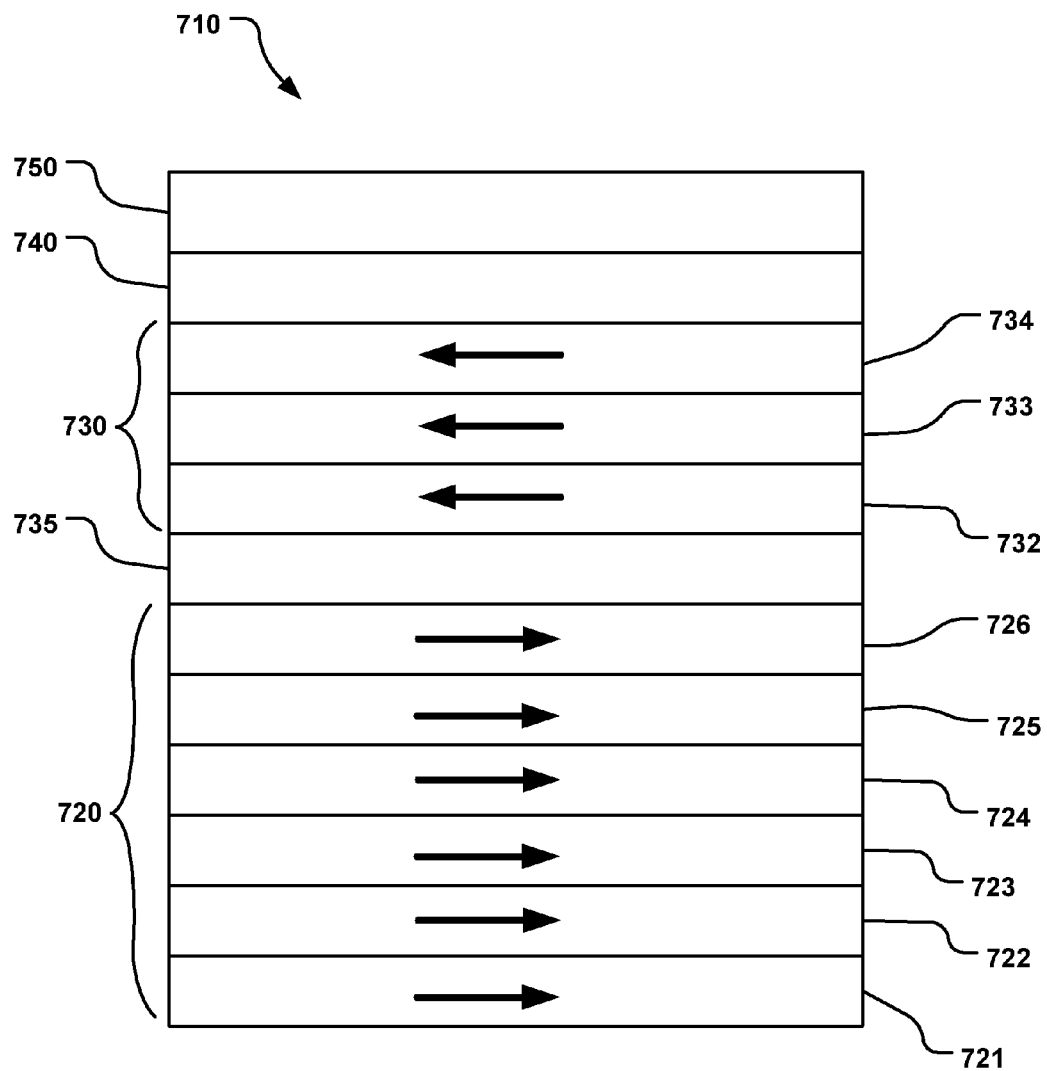
FIG. 7 is a schematic ABS view of another example SAF portion of a composite top shield.

FIG. 7 illustrates a schematic block diagram of an ABS view of another example implementation of a SAF portion 710 that can be incorporated into a composite top shield. The various features and elements of the SAF portion 710 are the same as or similar to like features and elements of the SAF portions 310, 410, 610, unless indicated otherwise. This SAF portion 710 has a three-layered laminated magnetic top structure and a five-layer plus seed layer laminated magnetic bottom structure.

Similar to the SAF portions 310, 410, 610, the SAF portion 710 has a lower or bottom laminated magnetic structure 720, a top laminated magnetic structure 730, and a non-magnetic spacer 735 there between. Both the bottom laminated magnetic structure 720 and the top laminated magnetic structure 730 are multilayer structures composed of at least one high moment layer, or, at least two high magnetic moment layers separated by a soft magnetic layer. The SAF portion 710 also has an AFM layer 740 and a non-magnetic capping layer 750.

In this implementation, the bottom laminated magnetic structure 720 has a magnetic seed layer 721, three high magnetic moment layers 722, 724, 726 and soft magnetic layers 723, 725 different than the layers 722, 724, 726. The number of high moment layers (i.e., layers 722, 724, 726) in the lower laminated magnetic structure 720 is X+1, where X is the number of soft magnetic layers (i.e., layers 723, 725).

The top laminated magnetic structure 730 has high magnetic moment layers 732, 734, and a soft magnetic layer 733 different than the layers 732, 734. The number of high moment layers (i.e., layers 732, 734) in the top laminated magnetic structure 730 is X+1, where X is the number of soft magnetic layers (i.e., layer 733).

One specific example of a SAF portion 710 has the following layers:

| Layer | Material | Layer thickness |
| --- | --- | --- |
| High Mag. Moment Layer 734 | CoFe65% | 4.5 nm |
| Soft Magnetic Layer 733 | NiFe21% | 14 nm |
| High Mag. Moment Layer 732 | CoFe65% | 3 nm |
| Non-magnetic Spacer 735 | Ru | 0.85 nm |
| High Mag. Moment Layer 726 | CoFe65% | 2 nm |
| Soft Magnetic Layer 725 | NiFe21% | 6 nm |
| High Mag. Moment Layer 724 | CoFe65% | 2.5 nm |
| Soft Magnetic Layer 723 | NiFe21% | 6 nm |
| High Mag. Moment Layer 722 | CoFe65% | 3 nm |
| Seed Layer 721 | NiFe21% | 0.5 nm |

Another specific example of a SAF portion 710 has the following layers:

| Layer | Material | Layer thickness |
| --- | --- | --- |
| High Mag. Moment Layer 734 | CoFe30% | 2 nm |
| Soft Magnetic Layer 733 | NiFe21% | 25 nm |
| High Mag. Moment Layer 732 | CoFe30% | 2 nm |
| Non-magnetic Spacer 735 | Ru | 0.85 nm |
| High Mag. Moment Layer 726 | CoFe30% | 2 nm |
| Soft Magnetic Layer 725 | NiFe21% | 4 nm |
| High Mag. Moment Layer 724 | CoFe30% | 3 nm |
| Soft Magnetic Layer 723 | NiFe21% | 4 nm |
| High Mag. Moment Layer 722 | CoFe30% | 7.5 nm |
| Seed Layer 721 | NiFe21% | 0.5 nm |

Figure 8:
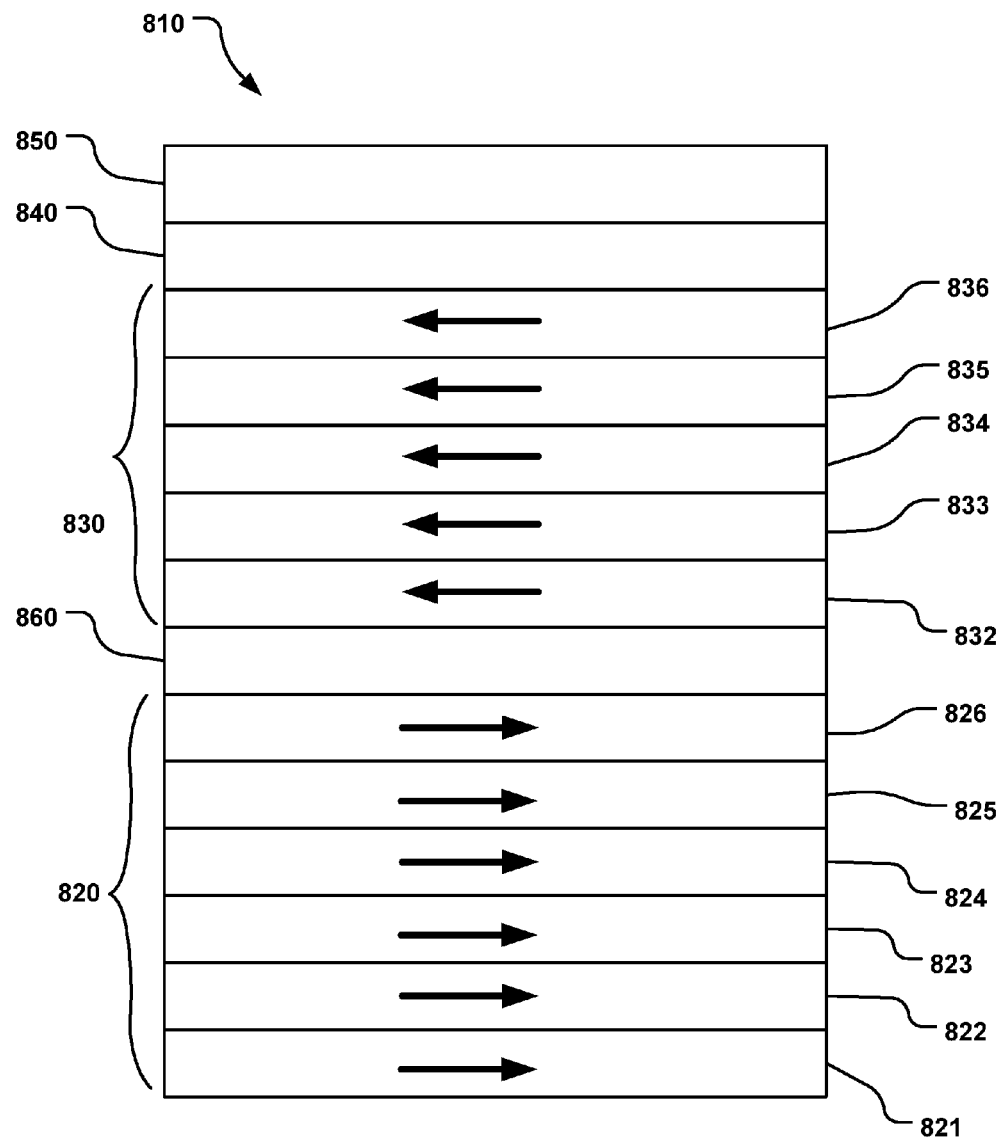
FIG. 8 is a schematic ABS view of another example SAF portion of a composite top shield.

FIG. 8 illustrates a schematic block diagram of an ABS view of yet another example implementation of a SAF portion 810 that can be incorporated into a composite top shield. The various features and elements of the SAF portion 810 are the same as or similar to like features and elements of the SAF portions 310, 410, 610, 710, unless indicated otherwise. This SAF portion 810 has a five-layered laminated magnetic top structure and a five-layer plus seed layer laminated magnetic bottom structure.

Similar to the SAF portions 310, 410, 610, 710, the SAF portion 810 has a lower or bottom laminated magnetic structure 820, a top laminated magnetic structure 830, and a non-magnetic spacer 860 there between. The SAF portion 810 also has an AFM layer 840 and a non-magnetic capping layer 850.

In this implementation, the bottom laminated magnetic structure 820 has a magnetic seed layer 821, three high magnetic moment layers 822, 824, 826 and two soft magnetic layers 823, 825 different than the layers 822, 824, 826. The number of high moment layers (i.e., layers 822, 824, 826) in the lower laminated magnetic structure 820 is X+1, where X is the number of soft magnetic layers (i.e., layers 823, 825).

The top laminated magnetic structure 830 has three high magnetic moment layers 832, 834, 836 and two soft magnetic layers 833, 835. The number of high magnetic moment layers (i.e., layers 832, 834, 836) in the top laminated magnetic structure 830 is X+1, where X is the number of soft magnetic layers (i.e., layers 833, 835).

One specific example of a SAF portion 810 has the following layers:

| Layer | Material | Layer thickness |
| --- | --- | --- |
| High Mag. Moment Layer 836 | CoFe65% | 3 nm |
| Soft Magnetic Layer 835 | NiFe21% | 6 nm |
| High Mag. Moment Layer 834 | CoFe65% | 3 nm |
| Soft Magnetic Layer 833 | NiFe21% | 6 nm |
| High Mag. Moment Layer 832 | CoFe65% | 2 nm |
| Non-magnetic Spacer 860 | Ru | 0.85 nm |
| High Mag. Moment Layer 826 | CoFe65% | 2 nm |
| Soft Magnetic Layer 825 | NiFe21% | 6 nm |
| High Mag. Moment Layer 824 | CoFe65% | 2.5 nm |
| Soft Magnetic Layer 823 | NiFe21% | 6 nm |
| High Mag. Moment Layer 822 | CoFe65% | 3 nm |
| Seed Layer 821 | NiFe21% | 0.5 nm |

Another specific example of a SAF portion 810 has the following layers:

| Layer | Material | Layer thickness |
| --- | --- | --- |
| High Mag. Moment Layer 836 | CoFe30% | 2 nm |
| Soft Magnetic Layer 835 | NiFe21% | 4 nm |
| High Mag. Moment Layer 834 | CoFe30% | 8 nm |
| Soft Magnetic Layer 833 | NiFe21% | 4 nm |
| High Mag. Moment Layer 832 | CoFe30% | 2 nm |
| Non-magnetic Spacer 860 | Ru | 0.85 nm |
| High Mag. Moment Layer 826 | CoFe30% | 2 nm |
| Soft Magnetic Layer 825 | NiFe21% | 4 nm |
| High Mag. Moment Layer 824 | CoFe30% | 3 nm |
| Soft Magnetic Layer 823 | NiFe21% | 4 nm |
| High Mag. Moment Layer 822 | CoFe30% | 7.5 nm |
| Seed Layer 821 | NiFe21% | 0.5 nm |

Figure 9:
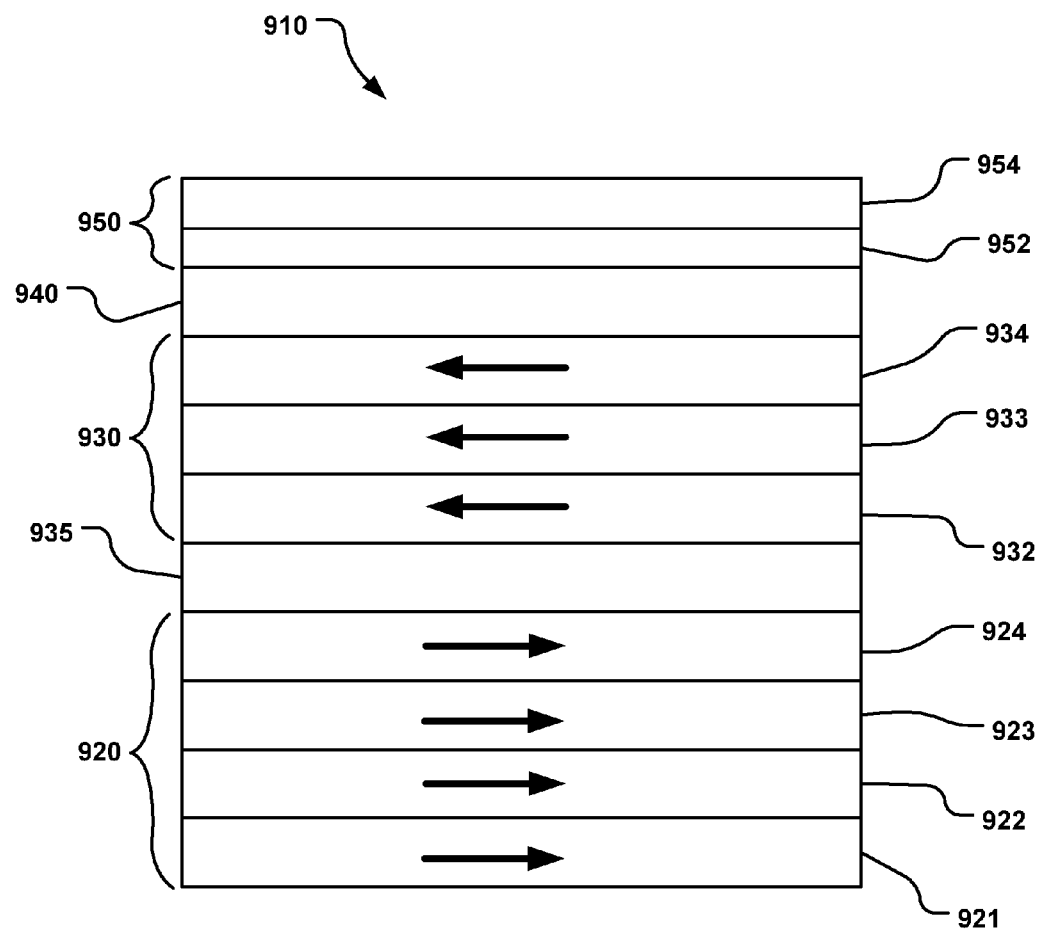
FIG. 9 is a schematic ABS view of another example SAF portion of a composite top shield, the SAF portion including two cap layers.

FIG. 9 illustrates a schematic block diagram of an ABS view of another example implementation of a SAF portion 910 that can be incorporated into a composite top shield. The various features and elements of the SAF portion 910 are the same as or similar to like features and elements of SAF portions 310, 410, 610 unless indicated otherwise. Similar to the SAF portion 610, SAF portion 910 has a three-layered laminated magnetic structure for the top structure and a three-layer plus seed layer laminated magnetic structure for the bottom structure.

The SAF portion 910 has a lower or bottom laminated magnetic structure 920, a top laminated magnetic structure 930, and a non-magnetic spacer 935 there between. Both bottom magnetic structure 920 and top magnetic structure 930 are multilayer structures that have at least two high magnetic moment layers separated by a soft layer. The SAF portion 910 also has an AFM layer 940 and a non-magnetic capping structure 950 that has a first capping layer 952 and a second capping layer 954.

The bottom laminated magnetic structure 920 has a magnetic seed layer 921, two high magnetic moment layers 922, 924 and a soft magnetic layer 923. The number of high moment layers (i.e., layers 922, 924) in the lower magnetic structure 920 is X+1, where X is the number of soft magnetic layers (i.e., layer 923).

The top magnetic structure 930 has high magnetic moment layers 932, 934, and a soft magnetic layer 933. The number of high moment layers (i.e., layers 932, 934) in the top magnetic structure 930 is X+1, where X is the number of soft magnetic layers (i.e., layer 933).

One specific example of a SAF portion 910 has the following layers:

| Layer | Material | Layer thickness |
| --- | --- | --- |
| Second Cap Layer 954 | NiCr | |
| First Cap Layer 952 | Ru | |
| AFM Layer 940 | IrMn | 7 nm |
| High Mag. Moment Layer 934 | CoFe30% | 2 nm |
| Soft Magnetic Layer 933 | NiFe | 25 nm |
| High Mag. Moment Layer 932 | CoFe30% | 2 nm |
| Non-magnetic Spacer 935 | Ru | 0.82 nm |
| High Mag. Moment Layer 924 | CoFe30% | 2 nm |
| Soft Magnetic Layer 923 | NiFe | 12.7 nm |
| High Mag. Moment Layer 922 | NiFe55% | 7.5 nm |
| Seed Layer 921 | NiFe | 0.5 nm |

Another specific example of a SAF portion 910 has the following layers:

| Layer | Material | Layer thickness |
| --- | --- | --- |
| Second Cap Layer 954 | NiCr | |
| First Cap Layer 952 | Ru | |
| AFM Layer 940 | IrMn | 7 nm |
| High Mag. Moment Layer 934 | CoFe30% | 2 nm |
| Soft Magnetic Layer 933 | NiFe | 25 nm |
| High Mag. Moment Layer 932 | CoFe30% | 2 nm |
| Non-magnetic Spacer 935 | Ru | 0.82 nm |
| High Mag. Moment Layer 924 | CoFe30% | 2 nm |
| Soft Magnetic Layer 923 | NiFe | 12.5 nm |
| High Mag. Moment Layer 922 | NiFe30% | 7.5 nm |
| Seed Layer 921 | NiFe | 0.5 nm |

All of the read sensors, shields, and SAF portions (e.g., top magnetic structure, bottom magnetic structure, etc.) described above, and variations thereof, can be fabricated by conventional methods, including plating, deposition, etching, milling, and other conventional processing techniques.

Figure 10:
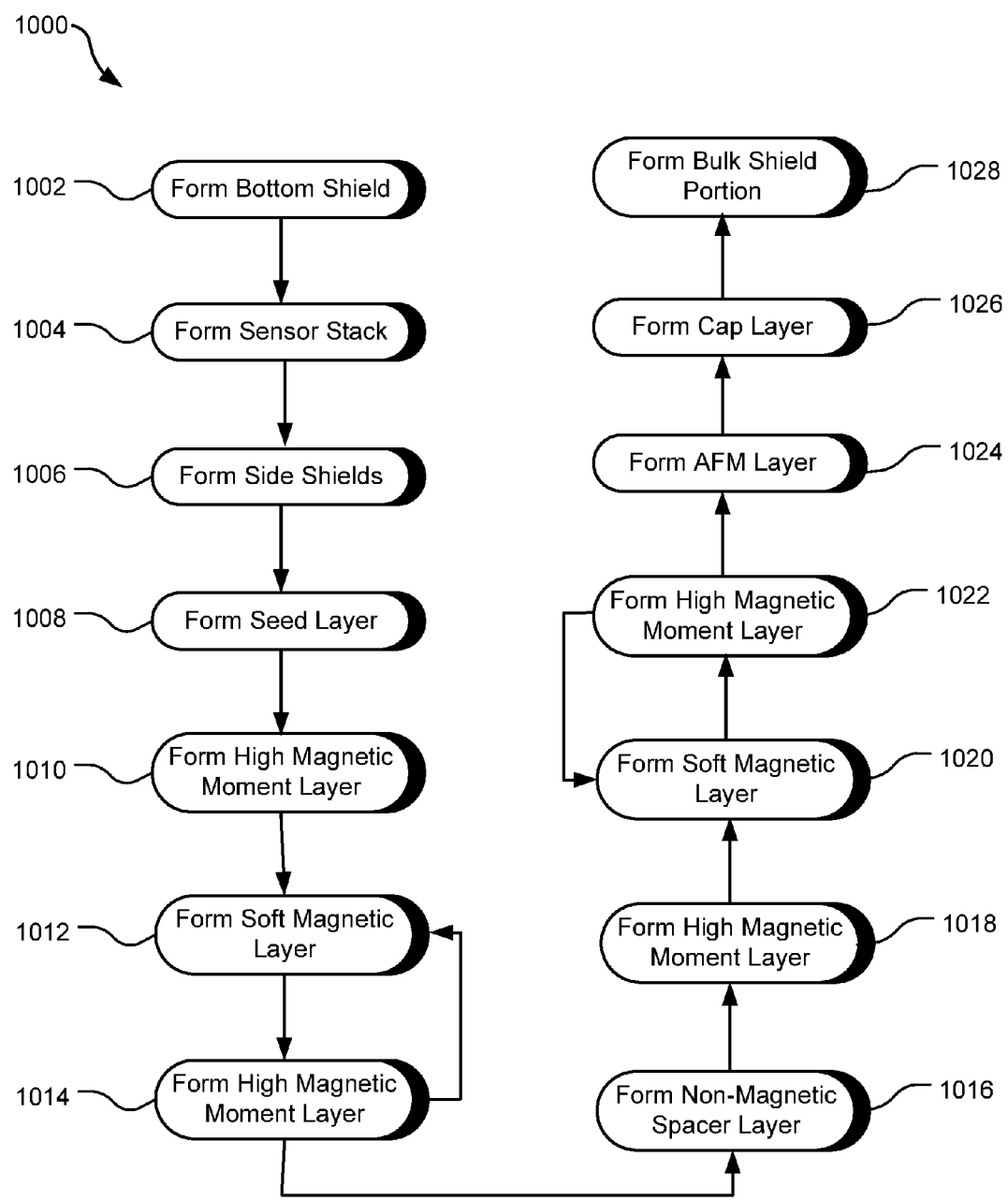
FIG. 10 is a flow diagram for an example method of making a sensor structure.

In reference now to FIG. 10, a flowchart illustrates an example method 1000 for forming a read sensor having a composite top shield with both a top laminated magnetic structure and a bottom laminated magnetic structure. It is understood that if only one laminated structure were desired (e.g., only a top laminated magnetic structure or only a bottom laminated magnetic structure), that the appropriate steps could be deleted or modified.

The method involves operation 1002 forming a bottom shield layer on a substrate. This operation does not require forming the bottom shield directly on the substrate, as intervening materials/layers may be present between the bottom shield and substrate. A sensor stack is formed on the bottom shield in operation 1004. This operation does not require forming the sensor stack directly on the substrate, as intervening materials/layers may be present between the bottom shield and sensor stack. In operation 1006, side shields are formed on the bottom shield around the sensor stack.

A composite top shield is formed on the sensor stack in operations 1008 through 1028. In this particular method 1000, the composite top shield is formed directly on and in contact with the sensor stack and side shields, however in other methods there may be intervening layer(s). In operations 1008 through 1014, the bottom magnetic structure of the composite shield is formed: in optional operation 1008, a seed layer is formed; in operation 1010, a layer of high magnetic moment material is formed on the optional seed layer; in operation 1012, a layer of soft magnetic material is formed on the high magnetic moment layer; and in operation 1014, a layer of high magnetic moment material is formed on the soft magnetic layer. Operations 1012 and 1014 can be repeated until the total number of desired magnetic layers is achieved. Then, a non-magnetic spacer is formed on the last high magnetic moment layer, in operation 1016. In operations 1018 through 1022, the top magnetic structure of the composite shield is formed: in operation 1018, a layer of high magnetic moment material is formed on the spacer; in operation 1020, a layer of soft magnetic material is formed on the high moment layer; and in operation 1022, a layer of high magnetic moment material is formed. Operations 1020 and 1022 can be repeated until the total number of desired magnetic layers is achieved. Then, an AFM layer is formed in operation 1024 on the last high magnetic moment layer, followed by a cap layer in operation 1026. A bulk shield portion is formed on the cap layer in operation 1028 to complete the sensor structure.

The above specification and examples provide a complete description of the structure and use of exemplary implementations of the invention. The above description provides specific implementations. It is to be understood that other implementations are contemplated and may be made without departing from the scope or spirit of the present disclosure. The above detailed description, therefore, is not to be taken in a limiting sense. While the present disclosure is not so limited, an appreciation of various aspects of the disclosure will be gained through a discussion of the examples provided.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

As used herein, the singular forms "a", "an", and "the" encompass implementations having plural referents, unless the content clearly dictates otherwise. As used in this specification and the appended claims, the term "or" is generally employed in its sense including "and/or" unless the content clearly dictates otherwise.

Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. A reader sensor comprising:
   a substrate;
   a sensor stack; and
   a top shield on a side of the sensor stack opposite the substrate, the top shield comprising a bulk shield portion and a SAF portion, the SAF portion comprising a top magnetic structure and a bottom magnetic structure with a non-magnetic layer therebetween, each of the magnetic structures comprising at least one soft magnetic material layer bounded on opposite sides by layers comprising magnetic material having a magnetic moment of at least 1.4 T.

2. The reader sensor of claim 1, wherein the magnetic material has a magnetic moment of at least 1.8.

3. The reader sensor of claim 1, wherein the magnetic material has a magnetic moment of at least 2.01.

4. The reader sensor of claim 1, wherein the magnetic material having a magnetic moment of at least 1.8 T is one of CoFe, CoFeB, CoFeNiB and FeCoNi, and FeSi, and FeC.

5. The reader sensor of claim 4, wherein the CoFe is greater than 5% Fe.

6. The reader sensor of claim 5, wherein the CoFe is CoFe 65%.

7. The reader sensor of claim 1, wherein the top magnetic structure has the same number of soft magnetic material layers and layers comprising magnetic material having a magnetic moment of at least 1.41 as the bottom magnetic structure.

8. The reader sensor of claim 1, wherein the top magnetic structure has a different number of soft magnetic material layers and layers comprising magnetic material having a magnetic moment of at least TAT than the bottom magnetic structure.

9. A reader sensor comprising:
   a substrate;
   a sensor stack; and
   a top shield on a side of the sensor stack opposite the substrate, the top shield comprising a bulk shield portion and a SAF portion, the SAF portion comprising a top magnetic structure and a bottom magnetic structure with a non-magnetic layer therebetween, each of the magnetic structures comprising at least one soft magnetic material layer bounded on opposite sides by high magnetic moment layers having a magnetic moment of at least 1.4 T.

10. The reader sensor of claim 9, wherein the high magnetic moment layers have a magnetic moment of at least 1.8 T.

11. The reader sensor of claim 9, wherein the high magnetic moment layers have a magnetic moment of at least 2.0 T.

12. The reader sensor of claim 9, wherein the high magnetic moment layers comprise at least one of CoFe, CoFeB, CoFeNiB and FeCoNi, and FeSi, and FeC.

13. The reader sensor of claim 12, wherein the CoFe is greater than 5% Fe.

14. The reader sensor of claim 13, wherein the CoFe is CoFe 65%.

15. The reader sensor of claim 9, wherein the top magnetic structure has the same number of soft magnetic material layers and high magnetic moment layers as the bottom magnetic structure.

16. The reader sensor of claim 9, wherein the top magnetic structure has a different number of soft magnetic material layers and high magnetic moment layers than the bottom magnetic structure.

17. A reader sensor comprising:
   a sensor stack; and
   a top shield comprising a bulk shield portion and a SAF portion, the SAF portion comprising a top magnetic structure and a bottom magnetic structure with a non-magnetic layer therebetween, each of the magnetic structures comprising "X" soft magnetic material layers and "X+1" high magnetic moment layers having a magnetic moment of at least 1.4 T, where "X" is at least one.

18. The reader sensor of claim 17, wherein "X" for the top magnetic structure is the same as "X" for the bottom magnetic structure.

19. The reader sensor of claim 17, wherein "X" for the top magnetic structure is different than "X" for the bottom magnetic structure.

20. The reader sensor of claim 17, wherein "X" is one.

* * * * *